United States Patent
Mulkens et al.

(10) Patent No.: US 10,495,981 B2
(45) Date of Patent: Dec. 3, 2019

(54) LITHOGRAPHIC APPARATUS AND DEVICE MANUFACTURING METHOD

(71) Applicant: ASML NETHERLANDS B.V., Veldhoven (NL)

(72) Inventors: Johannes Catharinus Hubertus Mulkens, Maastricht (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/479,084

(22) Filed: Apr. 4, 2017

(65) Prior Publication Data

US 2017/0205714 A1    Jul. 20, 2017

Related U.S. Application Data

(63) Continuation of application No. 14/871,743, filed on Sep. 30, 2015, which is a continuation of application No. 13/951,222, filed on Jul. 25, 2013, now Pat. No. 9,477,159, which is a continuation of application No. 12/913,461, filed on Oct. 27, 2010, now Pat. No. 8,514,369, which is a continuation of application No. 11/984,934, filed on Nov. 26, 2007, now Pat. No. 7,843,551, which is a continuation of application No. 11/071,579, filed on Mar. 4, 2005, now Pat. No. 7,324,185.

(51) Int. Cl.
*G03F 7/20* (2006.01)

(52) U.S. Cl.
CPC ........ *G03F 7/70341* (2013.01); *G03F 7/2041* (2013.01); *G03F 7/70058* (2013.01); *G03F 7/70108* (2013.01); *G03F 7/70225* (2013.01); *G03F 7/70358* (2013.01); *G03F 2007/2067* (2013.01)

(58) Field of Classification Search
CPC ................ G03F 7/70341; G03F 7/70058
USPC ................................. 355/30, 53, 67
See application file for complete search history.

(56) References Cited

U.S. PATENT DOCUMENTS

| | | | |
|---|---|---|---|
| 1,954,755 | A | 4/1934 | Heine |
| 3,573,975 | A | 4/1971 | Dhaka et al. |
| 3,648,587 | A | 3/1972 | Stevens |
| 4,346,164 | A | 8/1982 | Tabarelli et al. |
| 4,390,273 | A | 6/1983 | Loebach et al. |

(Continued)

FOREIGN PATENT DOCUMENTS

| | | |
|---|---|---|
| DE | 206 607 | 2/1984 |
| DE | 221 563 | 4/1985 |
| DE | 224 448 | 7/1985 |
| DE | 242 880 | 2/1987 |
| EM | 200213194 | 2/2002 |

(Continued)

OTHER PUBLICATIONS

Non-Final Office Action dated Oct. 11, 2017 in corresponding U.S. Appl. No. 15/482,587.

(Continued)

*Primary Examiner* — Hung Nguyen
(74) *Attorney, Agent, or Firm* — Pillsbury Winthrop Shaw Pittman LLP

(57) ABSTRACT

In an embodiment, a lithographic projection apparatus has an off-axis image field and a concave refractive lens as the final element of the projection system. The concave lens can be cut-away in parts not used optically to prevent bubbles from being trapped under the lens.

33 Claims, 3 Drawing Sheets

(56) References Cited

U.S. PATENT DOCUMENTS

| | | |
|---|---|---|
| 4,396,705 A | 8/1983 | Akeyama et al. |
| 4,405,701 A | 9/1983 | Banks et al. |
| 4,480,910 A | 11/1984 | Takanashi et al. |
| 4,509,852 A | 4/1985 | Tabarelli et al. |
| 4,624,555 A | 11/1986 | Tokuhara et al. |
| 4,747,678 A | 5/1988 | Shafer et al. |
| 4,953,960 A | 9/1990 | Williamson |
| 5,040,020 A | 8/1991 | Rauschenbach et al. |
| 5,121,256 A | 6/1992 | Corle et al. |
| 5,212,593 A | 5/1993 | Williamson et al. |
| 5,298,939 A | 3/1994 | Swanson et al. |
| 5,537,260 A | 7/1996 | Williamson |
| 5,610,683 A | 3/1997 | Takahashi |
| 5,699,197 A | 12/1997 | Otaki |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. |
| 6,407,884 B1 | 6/2002 | Osborne et al. |
| 6,473,243 B1 | 10/2002 | Omura |
| 6,486,940 B1 | 11/2002 | Williamson |
| 6,600,547 B2 | 7/2003 | Watson et al. |
| 6,603,130 B1 | 8/2003 | Bisschops et al. |
| 6,671,246 B1 | 12/2003 | Matsuo |
| 6,878,916 B2 | 4/2005 | Schuster |
| 6,909,492 B2 | 6/2005 | Omura |
| 6,952,253 B2 | 10/2005 | Lof et al. |
| 7,075,616 B2 | 7/2006 | Derksen et al. |
| 7,088,422 B2 * | 8/2006 | Hakey ............. G03F 7/70258 250/491.1 |
| 7,088,433 B1 | 8/2006 | Hakey et al. |
| 7,184,122 B2 | 2/2007 | Sengers et al. |
| 7,215,410 B2 | 5/2007 | Sumiyoshi |
| 7,256,868 B2 | 8/2007 | Akamatsu |
| 7,292,316 B2 | 11/2007 | Kohno |
| 7,324,185 B2 | 1/2008 | Mulkens et al. |
| 7,352,434 B2 | 4/2008 | Streefkerk et al. |
| 7,362,508 B2 | 4/2008 | Omura et al. |
| 7,369,217 B2 | 5/2008 | Carroll |
| 7,411,653 B2 | 8/2008 | Hoogendam et al. |
| 7,411,654 B2 | 8/2008 | Beckers et al. |
| 7,433,019 B2 | 10/2008 | Kiuchi et al. |
| 7,528,929 B2 | 5/2009 | Streefkerk et al. |
| 7,697,111 B2 | 4/2010 | Shirai et al. |
| 7,800,422 B2 | 9/2010 | Lee et al. |
| 7,843,551 B2 | 11/2010 | Mulkens et al. |
| 7,852,456 B2 | 12/2010 | Nagasaka |
| 7,993,008 B2 | 8/2011 | Shirai et al. |
| 8,149,381 B2 | 4/2012 | Shirai et al. |
| 8,189,170 B2 | 5/2012 | Shirai et al. |
| 8,248,577 B2 | 8/2012 | Streefkerk et al. |
| 8,854,601 B2 | 10/2014 | Omura et al. |
| 9,310,696 B2 | 4/2016 | Omura et al. |
| 9,360,763 B2 | 6/2016 | Omura et al. |
| 9,429,851 B2 | 8/2016 | Omura et al. |
| 2001/0012101 A1 | 8/2001 | Mulkens |
| 2001/0033437 A1 | 10/2001 | Meehan et al. |
| 2002/0011298 A1 | 1/2002 | Jain et al. |
| 2002/0020821 A1 | 2/2002 | Van Santen et al. |
| 2002/0027718 A1 | 3/2002 | Kreuzer |
| 2002/0027719 A1 | 3/2002 | Kreuzer |
| 2002/0027863 A1 | 3/2002 | Kikuchi et al. |
| 2002/0089734 A1 | 7/2002 | Meehan et al. |
| 2002/0089758 A1 | 7/2002 | Hori |
| 2002/0163629 A1 | 11/2002 | Switkes et al. |
| 2003/0011755 A1 | 1/2003 | Omura et al. |
| 2003/0123040 A1 | 7/2003 | Almogy |
| 2003/0189696 A1 | 10/2003 | Sumiyoshi et al. |
| 2004/0000627 A1 | 1/2004 | Schuster |
| 2004/0075895 A1 | 4/2004 | Lin |
| 2004/0114117 A1 | 6/2004 | Bleeker |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0207824 A1 | 10/2004 | Lof et al. |
| 2004/0211920 A1 | 10/2004 | Derksen et al. |
| 2004/0239954 A1 | 12/2004 | Bischoff |
| 2004/0257544 A1 | 12/2004 | Vogel et al. |
| 2004/0263809 A1 | 12/2004 | Nakano |
| 2005/0007569 A1 | 1/2005 | Streefkerk et al. |
| 2005/0018155 A1 | 1/2005 | Cox et al. |
| 2005/0024609 A1 | 2/2005 | De Smit et al. |
| 2005/0030497 A1 | 2/2005 | Nakamura |
| 2005/0041225 A1 | 2/2005 | Sengers et al. |
| 2005/0046813 A1 | 3/2005 | Streefkerk et al. |
| 2005/0046934 A1 | 3/2005 | Ho et al. |
| 2005/0052632 A1 | 3/2005 | Miyajima |
| 2005/0068639 A1 | 3/2005 | Pierrat et al. |
| 2005/0078286 A1 | 4/2005 | Dierichs et al. |
| 2005/0078287 A1 | 4/2005 | Sengers et al. |
| 2005/0088635 A1 | 4/2005 | Hoogendam et al. |
| 2005/0094116 A1 | 5/2005 | Flagello et al. |
| 2005/0094125 A1 | 5/2005 | Arai |
| 2005/0122505 A1 | 6/2005 | Miyajima |
| 2005/0132914 A1 | 6/2005 | Mulkens et al. |
| 2005/0134817 A1 | 6/2005 | Nakamura |
| 2005/0140948 A1 | 6/2005 | Tokita |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0151942 A1 | 7/2005 | Kawashima |
| 2005/0179877 A1 | 8/2005 | Mulkens et al. |
| 2005/0200815 A1 | 9/2005 | Akamatsu |
| 2005/0213065 A1 | 9/2005 | Kitaoka |
| 2005/0213066 A1 | 9/2005 | Sumiyoshi |
| 2005/0219489 A1 | 10/2005 | Nei et al. |
| 2005/0232120 A1 | 10/2005 | Shinoda |
| 2005/0233081 A1 | 10/2005 | Tokita |
| 2005/0237502 A1 | 10/2005 | Kawashima |
| 2006/0077788 A1 | 4/2006 | Shinoda |
| 2006/0077789 A1 | 4/2006 | Shinoda et al. |
| 2006/0103821 A1 | 5/2006 | Hendricus Verspay et al. |
| 2006/0139586 A1 | 6/2006 | Wegmann et al. |
| 2006/0176461 A1 | 8/2006 | Sekine |
| 2006/0139583 A1 | 9/2006 | Wegmann et al. |
| 2006/0232756 A1 | 10/2006 | Lof et al. |
| 2006/0244938 A1 | 11/2006 | Schuster |
| 2006/0250601 A1 | 11/2006 | Streefkerk et al. |
| 2007/0201012 A1 | 8/2007 | Loopstra et al. |
| 2007/0285633 A1 | 12/2007 | Ikezawa et al. |
| 2007/0285637 A1 | 12/2007 | Dorsel et al. |
| 2008/0018866 A1 | 1/2008 | Nagasaka et al. |
| 2009/0002660 A1 | 1/2009 | Kiuchi |
| 2009/0046268 A1 | 2/2009 | Omura et al. |
| 2011/0051112 A1 | 3/2011 | Nagasaka |
| 2013/0194560 A1 | 8/2013 | Omura et al. |
| 2015/0029476 A1 | 1/2015 | Omura et al. |
| 2015/0029482 A1 | 1/2015 | Omura et al. |

FOREIGN PATENT DOCUMENTS

| | | |
|---|---|---|
| EM | 2004053534 | 6/2004 |
| EM | 2004088650 | 10/2004 |
| EM | 2004097911 | 11/2004 |
| EM | 2004107011 | 12/2004 |
| EM | 2005101121 | 10/2005 |
| EP | 0023231 | 2/1981 |
| EP | 0418427 | 3/1991 |
| EP | 0764858 | 3/1997 |
| EP | 1 039 458 | 9/2000 |
| EP | 1039511 | 9/2000 |
| EP | 1 098 215 | 5/2001 |
| EP | 1280007 | 1/2003 |
| EP | 1 420 298 | 5/2004 |
| EP | 1 420 300 | 5/2004 |
| EP | 1 477 856 | 11/2004 |
| EP | 1480065 | 11/2004 |
| EP | 1 494 079 | 1/2005 |
| EP | 1 519 230 | 3/2005 |
| EP | 1 524 558 | 4/2005 |
| EP | 1 646 074 | 4/2006 |
| EP | 1 670 038 | 6/2006 |
| EP | 1881521 | 1/2008 |

(56) References Cited

FOREIGN PATENT DOCUMENTS

| | | |
|---|---|---|
| FR | 2474708 | 7/1981 |
| GB | 669921 | 4/1952 |
| JP | 58-202448 | 11/1983 |
| JP | S59-19912 | 2/1984 |
| JP | 62-065326 | 3/1987 |
| JP | 62-121417 | 6/1987 |
| JP | 63-157419 | 6/1988 |
| JP | H04130710 | 5/1992 |
| JP | H04133414 | 5/1992 |
| JP | H04211110 | 8/1992 |
| JP | H04273245 | 9/1992 |
| JP | 04-305915 | 10/1992 |
| JP | 04-305917 | 10/1992 |
| JP | H0545886 | 2/1993 |
| JP | 06-124873 | 5/1994 |
| JP | 07-132262 | 5/1995 |
| JP | H07122469 | 5/1995 |
| JP | H07135165 | 5/1995 |
| JP | 07-220990 | 8/1995 |
| JP | 08-334695 | 12/1996 |
| JP | H09-82626 | 3/1997 |
| JP | H10-3039 | 1/1998 |
| JP | H1020195 | 1/1998 |
| JP | H10-55713 | 2/1998 |
| JP | H10-92735 | 4/1998 |
| JP | H10-97969 | 4/1998 |
| JP | H10-189427 | 7/1998 |
| JP | 10-228661 | 8/1998 |
| JP | 10-255319 | 9/1998 |
| JP | 10-303114 | 11/1998 |
| JP | 10-340846 | 12/1998 |
| JP | H11-162831 | 6/1999 |
| JP | 11-176727 | 7/1999 |
| JP | H11-283903 | 10/1999 |
| JP | 2000/003874 | 1/2000 |
| JP | 2000/012453 | 1/2000 |
| JP | 2000012453 | 1/2000 |
| JP | 2000-058436 | 2/2000 |
| JP | 2000/114157 | 4/2000 |
| JP | 2001-091849 | 4/2001 |
| JP | 2001/110707 | 4/2001 |
| JP | 2001/228401 | 8/2001 |
| JP | 2001/307982 | 11/2001 |
| JP | 2002/057097 | 2/2002 |
| JP | 2002/093690 | 3/2002 |
| JP | 2002/100561 | 4/2002 |
| JP | 2002/118058 | 4/2002 |
| JP | 2002236242 | 8/2002 |
| JP | 2002/277742 | 9/2002 |
| JP | 2002/323658 | 11/2002 |
| JP | 2002/373849 | 12/2002 |
| JP | 2003/059803 | 2/2003 |
| JP | 2003/059821 | 2/2003 |
| JP | 2003/114387 | 4/2003 |
| JP | 2003/307679 | 10/2003 |
| JP | 2004/145269 | 5/2004 |
| JP | 2004-193252 | 7/2004 |
| JP | 2004/205698 | 7/2004 |
| JP | 2004/207711 | 7/2004 |
| JP | 2004/228497 | 8/2004 |
| JP | 2004/259966 | 9/2004 |
| JP | 2004-289128 | 10/2004 |
| JP | 2004/303808 | 10/2004 |
| JP | 2004-333761 | 11/2004 |
| JP | 2004/356205 | 12/2004 |
| JP | 2005/019864 | 1/2005 |
| JP | 2005-045265 | 2/2005 |
| JP | 2005/086148 | 3/2005 |
| JP | 2005/093997 | 4/2005 |
| JP | 2005/115127 | 4/2005 |
| JP | 2005/116570 | 4/2005 |
| JP | 2005136404 | 5/2005 |
| JP | 2005-167211 | 6/2005 |
| JP | 2005/175176 | 6/2005 |
| JP | 2005/233979 | 9/2005 |
| JP | 2005/257740 | 9/2005 |
| JP | 2005/268700 | 9/2005 |
| JP | 2005/268741 | 9/2005 |
| JP | 2005/303167 | 10/2005 |
| JP | 2005/536775 | 12/2005 |
| JP | 2006/024706 | 1/2006 |
| JP | 2006/024819 | 1/2006 |
| JP | 2006/032750 | 2/2006 |
| JP | 2006/128192 | 5/2006 |
| JP | 2006-140459 | 6/2006 |
| JP | 2006/222222 | 8/2006 |
| JP | 2007/005830 | 1/2007 |
| JP | 2007-019463 | 1/2007 |
| JP | 2007/507881 | 3/2007 |
| WO | 99/27568 | 6/1999 |
| WO | 99/49504 | 9/1999 |
| WO | 01/65296 | 9/2001 |
| WO | 03/077036 | 9/2003 |
| WO | 03/085708 | 10/2003 |
| WO | 2004/019128 | 3/2004 |
| WO | 2004/053596 | 6/2004 |
| WO | 2004/053950 | 6/2004 |
| WO | 2004/053951 | 6/2004 |
| WO | 2004/053952 | 6/2004 |
| WO | 2004/053953 | 6/2004 |
| WO | 2004/053954 | 6/2004 |
| WO | 2004/053955 | 6/2004 |
| WO | 2004/053956 | 6/2004 |
| WO | 2004/053957 | 6/2004 |
| WO | 2004/053958 | 6/2004 |
| WO | 2004/053959 | 6/2004 |
| WO | 2004/055803 | 7/2004 |
| WO | 2004/057589 | 7/2004 |
| WO | 2004/057590 | 7/2004 |
| WO | 2004/086468 | 10/2004 |
| WO | 2004/086470 | 10/2004 |
| WO | 2004/090577 | 10/2004 |
| WO | 2004/090633 | 10/2004 |
| WO | 2004/090634 | 10/2004 |
| WO | 2004/090956 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2004/105106 | 12/2004 |
| WO | 2004/105107 | 12/2004 |
| WO | 2004/107048 | 12/2004 |
| WO | 2004/107417 | 12/2004 |
| WO | 2004/114380 | 12/2004 |
| WO | 2005/006415 | 1/2005 |
| WO | 2005/006417 | 1/2005 |
| WO | 2005/006418 | 1/2005 |
| WO | 2005/010611 | 2/2005 |
| WO | 2005/020298 | 3/2005 |
| WO | 2005/022615 | 3/2005 |
| WO | 2005/024517 | 3/2005 |
| WO | 2005/029559 | 3/2005 |
| WO | 2005/034174 | 4/2005 |
| WO | 2005/041276 | 5/2005 |
| WO | 2005/067013 | 7/2005 |
| WO | 2005/104195 | 11/2005 |
| WO | 2006/018972 | 2/2006 |
| WO | 2006/025341 | 3/2006 |
| WO | 2006/043457 | 4/2006 |
| WO | 2006/121009 | 11/2006 |
| WO | 2007/055373 | 5/2007 |
| WO | 2007/132862 | 11/2007 |
| WO | 2008/031576 | 3/2008 |

OTHER PUBLICATIONS

*Carl Zeiss SMT GmbH v. Nikon Corporation*, Invalidity Action relating to European Patent No. 1 881 521, (Aug. 16, 2017), 68 pages.

M. Switkes et al., "Immersion Lithography at 157 nm", MIT Lincoln Lab, Orlando 2001-1, Dec. 17, 2001.

(56) References Cited

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci, Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, J. Microlith., Microfab., Microsyst. 1(1):7-12 (2002).
Notice of Reasons for Rejection for Japanese Patent Application No. 2006-057450 dated May 7, 2009.
Information Disclosure Statement as filed for U.S. Appl. No. 11/665,049, dated Sep. 7, 2007 (1 page).
Non-Final Office Action as issued for U.S. Appl. No. 11/665,049, dated Sep. 18, 2008.
Non-Final Office Action as issued for U.S. Appl. No. 11/665,049, dated Feb. 25, 2009.
Final Office Action as issued for U.S. Appl. No. 11/665,049, dated Aug. 14, 2009.
Japanese Office Action dated Apr. 10, 2012 in corresponding Japanese Patent Application No. 2009-287629.
U.S. Office Action dated Oct. 8, 2015 in corresponding U.S. Appl. No. 13/951,222.
U.S. Office Action dated Feb. 9, 2016 in corresponding U.S. Appl. No. 14/484,076.
U.S. Office Action dated Feb. 25, 2016 in corresponding U.S. Appl. No. 13/951,222.
U.S. Office Action dated Nov. 25, 2016 in corresponding U.S. Appl. No. 14/871,795.
Final Office Action dated May 25, 2017 in corresponding U.S. Appl. No. 14/871,795 (9 pages).
Reply filed Jan. 12, 2018, in *Nikon Corporation* vs. *Carl Zeiss SMT GmbH*, EP Patent No. 1881521 (68 pages).
Statement of Defence by Carl Zeiss dated Aug. 15, 2017 in *Nikon Corporation* vs. *Carl Zeiss SMT GmbH*, Mannheim Regional Court, $7^{th}$ Civil Chamber, (69 pages).
Surrejoinder by Nikon dated Apr. 19, 2018 in *Nikon Corporation* vs. *Carl Zeiss SMT GmbH*, Mannheim Regional Court, $7^{th}$ Civil Chamber, (27 pages).
Rebutter by Carl Zeiss dated Jun. 22, 2018 in *Nikon Corporation* vs. *Carl Zeiss SMT GmbH*, Mannheim Regional Court, $7^{th}$ Civil Chamber, (63 pages).
Fifth Rejoinder by Nikon dated Jun. 22, 2018 in *Nikon Corporation* vs. *Carl Zeiss Smt GmbH*, Mannheim Regional Court, $7^{th}$ Civil Chamber, (32 pages).
Owa et al., "Nikon Immersion Exposure Tool Development," International Symposium on Immersion and 157nm Lithography, Sematech, Vancouver, B.C., Canada (Aug., 2004).
Owa et al., "Feasibility of Immersion Lithography," Proc. of SPIE, vol. 5377, pp. 264-272 (May, 2004).
Lin et al., "Immersion Lithography and Its Impact on Semiconductor Manufacturing," Proc. of SPIE, vol. 5377, pp. 46-67 (May, 2004).
Van Den Hove et al., "Lithography for sub-90nm Applications," International Electron Devices Meeting (IEDM), pp. 3-8 (2002).
Kameyama et al., "Extension of Photolithography," Proc. of Spie, vol. 5446, pp. 451-461 (Aug. 2004).
Ulrich et al., "The Development of Dioptric Projection Lenses for DUV Lithography," Proc. of SPIE, vol. 4832, pp. 158-169 (2002).
Nataraj et al., "Liquid Immersion Lens Technology Applied to Laser Voltage Probing of 130nm Process Technology Devices," Journal of Vacuum Science and Technology, Technology B, vol. 20, No. 6, pp. 3067-3070 (Nov./Dec. 2002).
Ohmura et al., "Catadioptric Lens Development for DUV and VUV Projection Optics," Proc. of Spie, vol. 5040, pp. 781-788 (2003).
Feldmann et al., "Catadioptric Projection Lenses for Immersion Lithography," Proc. of Spie, vol. 5962, pp. 59620Y-1 to 59620Y-8 (2005).
Complaint by Nikon Corporation dated Apr. 24, 2017, in *Nikon Corporation* vs. *Carl Zeiss SMT GmbH* in German re European Patent No. EP1881521 (171 pages).
Rejoinder by Carl Zeiss SMT GmbH dated Apr. 9, 2018 in *Nikon Corporation* vs. *Carl Zeiss Smt GmbH* in German re European Patent No. EP1881521 (145 pages).
Minutes of the Oral Hearing Proceedings in the European Patent Office (EPO) dated Mar. 31, 2017, in European Patent Application No. EP13174486.4 (7 pages).
Brief by Nikon Corporation dated Mar. 2, 2018, in *Carl Zeiss SMT GmbH* v. *Nikon Corporation* in Germany re European Patent No. EP1881521 (45 pages).

* cited by examiner

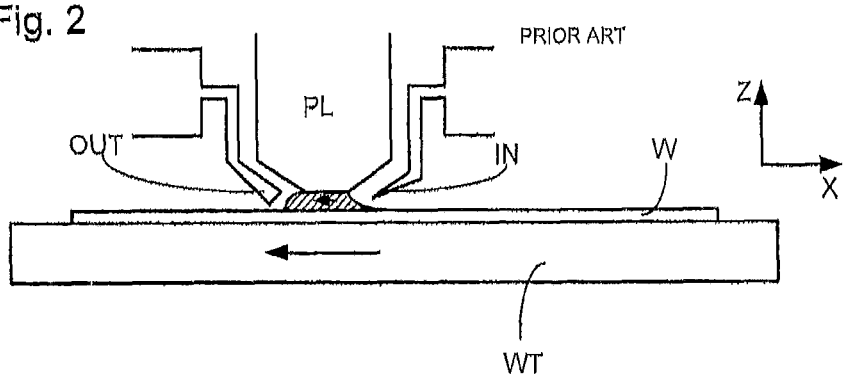
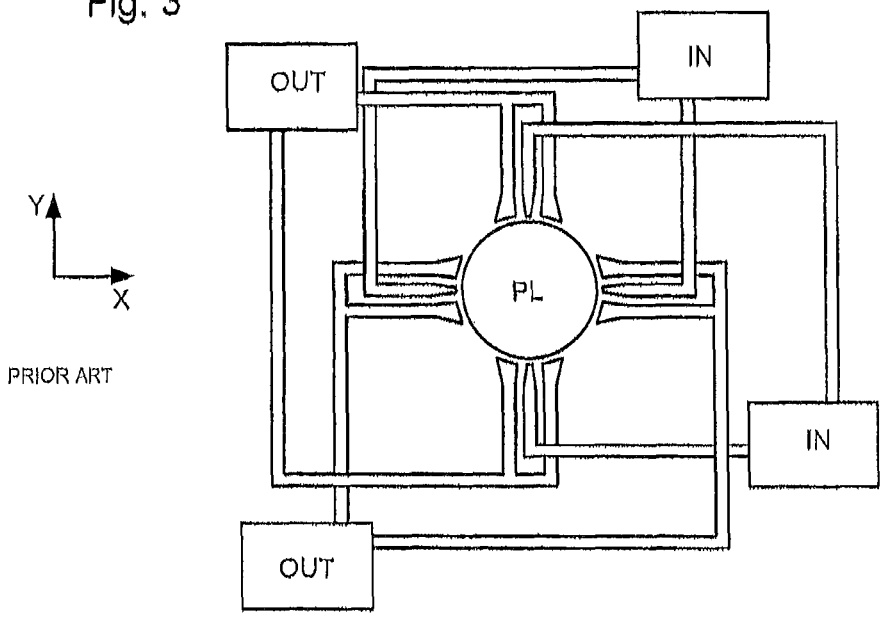
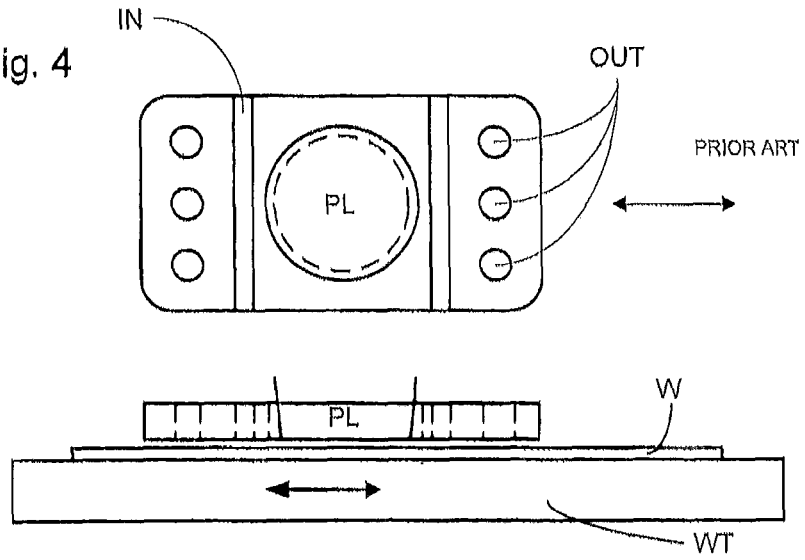

LITHOGRAPHIC APPARATUS AND DEVICE MANUFACTURING METHOD

This application is a continuation of U.S. patent application Ser. No. 14/871,743, filed Sep. 30, 2015, now allowed, which is a continuation of U.S. patent application Ser. No. 13/951,222, filed Jul. 25, 2013, now U.S. Pat. No. 9,477,159, which is a continuation of U.S. patent application Ser. No. 12/913,461, filed Oct. 27, 2010, now U.S. Pat. No. 8,514,369, which is a continuation of U.S. patent application Ser. No. 11/984,934, filed Nov. 26, 2007, now U.S. Pat. No. 7,843,551, which is a continuation of U.S. patent application Ser. No. 11/071,579, filed Mar. 4, 2005, now U.S. Pat. No. 7,324,185, each of the foregoing applications is incorporated herein its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling the use of a larger effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In an immersion lithography apparatus, air (or other gas) bubbles may become trapped under a final optical element of the projection system where they may cause one or more faults, e.g. distortion or a blank spot, in the projected image. In particular, if a concave final optical element is used, the bubbles will tend to become trapped under the very center of the optical element, i.e. on axis, where they could cause most harm. It can be difficult to arrange a liquid flow that will entrain and remove bubbles from under the center of such an optical element. However, a concave last lens element may be desirable to enable the realize a high NA projection system.

Accordingly, it would be advantageous, for example, to provide an immersion lithographic apparatus having a concave lens element as the final element of the projection system in which harmful effects of bubbles being trapped under the last lens element can be avoided.

According to an aspect of the invention, there is provided a lithographic projection apparatus, comprising:

a projection system configured to project a patterned beam of radiation into an image field that is positioned off the optical axis of the projection system and onto a target portion of a substrate, the projection system comprising a concave refractive lens adjacent the substrate through which the patterned beam is projected; and a liquid supply system configured to provide a liquid to a space between the substrate and the lens.

According to a further aspect of the invention, there is provided a device manufacturing method, comprising projecting an image of a pattern through a liquid onto a target portion of a substrate using a projection system, the projection system comprising a concave refractive lens adjacent the substrate through which the image is projected and the image field of the projection system being off-axis.

According to a further aspect of the invention, there is provided a lithographic apparatus, comprising:

a projection system configured to project a patterned beam of radiation onto a target portion of a substrate, the projection system comprising an optical element adjacent the substrate and having a surface configured to be in contact with liquid, the surface being inclined at an angle to a horizontal plane and comprising a first portion through which the patterned beam is configured to pass and a second portion, higher than the first portion, through which the patterned does not pass; and a liquid supply system configured to provide a liquid to a space between the substrate and the optical element.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
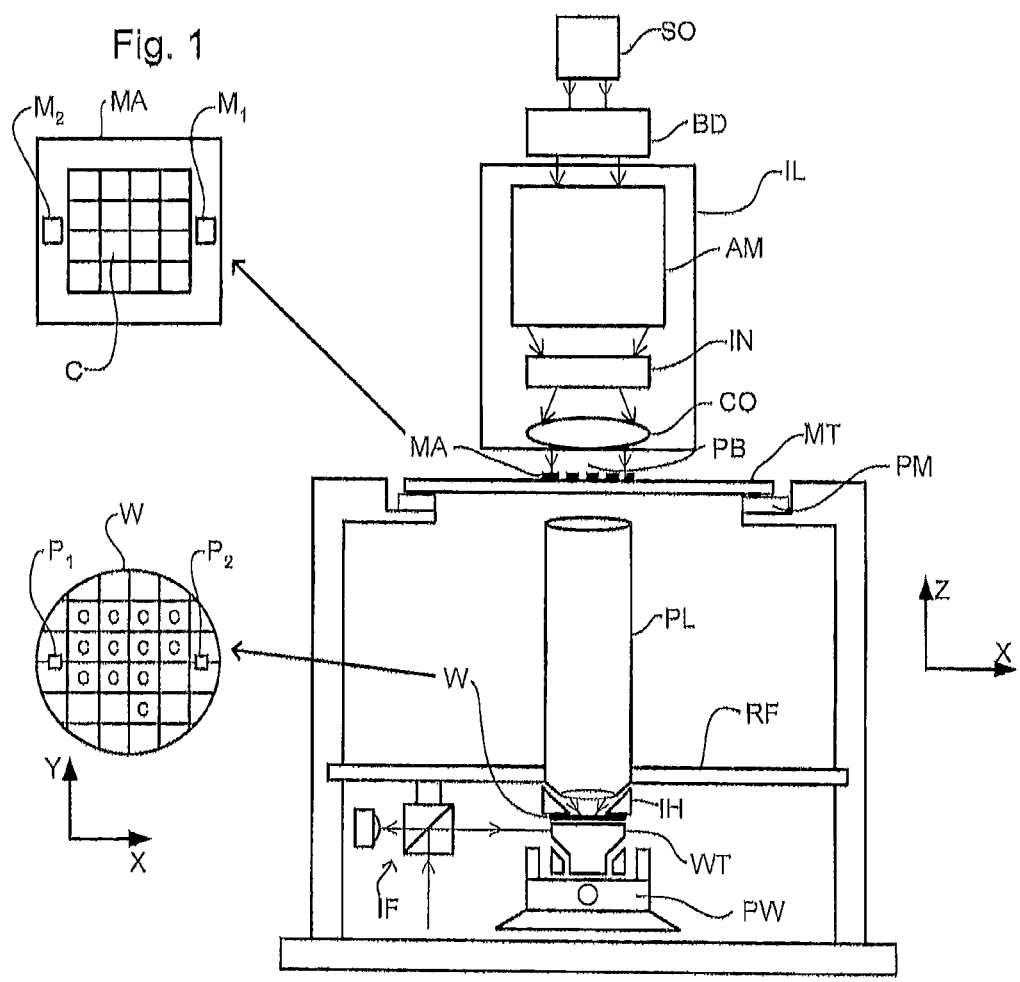
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables or support structures may be used in parallel, or preparatory steps may be carried out on one or more tables or support structure while one or more other tables or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
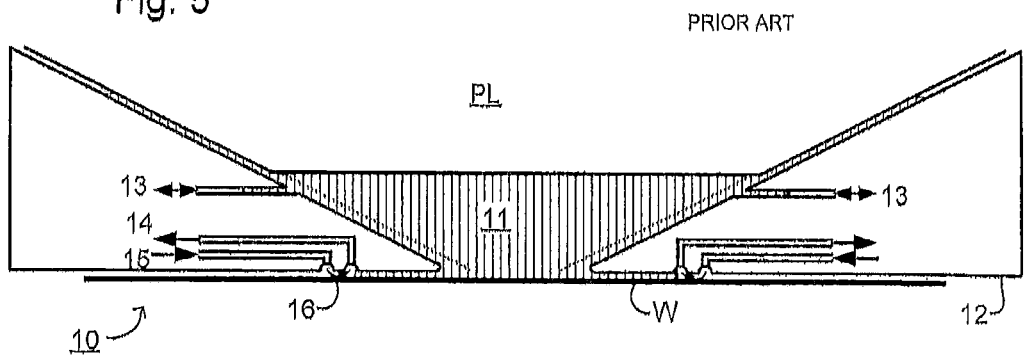
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). See, for example, U.S. patent application Ser. No. 10/844,575, hereby incorporated in its entirety by reference. A seal is typically formed between the liquid confinement structure and the surface of the substrate. In an embodiment, the seal is a contactless seal such as a gas seal.

FIG. 5 shows a liquid supply system (sometimes referred to as the immersion hood or showerhead) according to an embodiment of the invention used to supply liquid to the space between the final element of the projection system and the substrate. Reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

Figure 6:
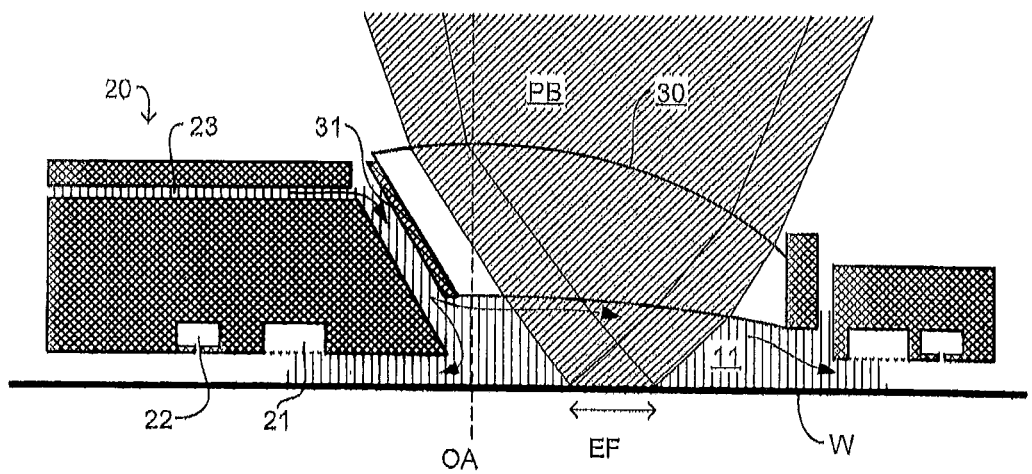
FIG. 6 depicts a final lens element and a liquid supply system in a lithographic projection apparatus according to an embodiment of the present invention.

FIG. 6 shows a view at substrate level in a lithographic projection apparatus according to an embodiment of the invention. In the embodiment, the final element of the projection system PL is a concave refractive lens 30 and the projection system as a whole is arranged to project an image of the patterning device MA onto an off-axis image field EF (also known as the slit). Various known designs of projection system, in particular catadioptric (comprising both reflective and refractive elements) designs have suitable off-axis image fields. In an embodiment, the final element of the projection system PL may be an optical element shaped other than a concave refractive lens, such as a plate or curved. Such an optical element has an inclined surface in contact with the liquid, the surface including a portion higher than a portion through which the projection beam PB passes. In this way, bubbles gravitating toward the optical element surface may move up the surface to the portion of the surface out of the path of the projection beam. An example optical element of this type may be a plate having a flat surface in contact with the liquid, a optical element having a curved surface in contact with the liquid, etc.

As the image field EF is off-axis, the projection beam PB is also located off-axis in the final element 30. This means that the final element 30 can be cut-away on the side of the optical axis OA away from the image field EF. This does not affect the projected image because no radiation would have passed through the cut-away portion. Of course, the lens itself need not be made by making a complete lens and cutting away parts (though this may be convenient) but can be made directly into the final shape, as desired.

The cut-away shape of the final lens element 30 has one or more advantages. Firstly, because the lens forms only about half of a dome, there is less, or no, chance of a bubble becoming trapped under the lens—a bubble can easily float through the cut-away. Indeed, because the image field EF is off-axis, a bubble that remains at the highest point under the lens for a little while, will likely be out of the beam path and hence will not affect the projected image.

Secondly, the cut-away allows provision of a liquid supply 23 above the bottom of the lens 30 so that the immersion liquid flow will be generally downwards, as indicated by arrows. Such a flow can help ensure that contaminants that leach out of the resist are kept away from the surface of the lens.

As shown in FIG. 6, the liquid confinement structure 20 will be shaped to match the shape of the bottom of the projection system but otherwise may operate on the same principles as known liquid confinement structures designed for use with projection systems having, for example, circular end parts. For example, the liquid confinement structure 20 may be provided with an extractor 21 connected to a low pressure source and covered by a porous membrane to extract immersion liquid and a gas knife 22 to prevent leakage of immersion fluid. Also, the holder 31 for the final lens element 30 will likely be shaped to fit the cut-away shape.

Figure 7:
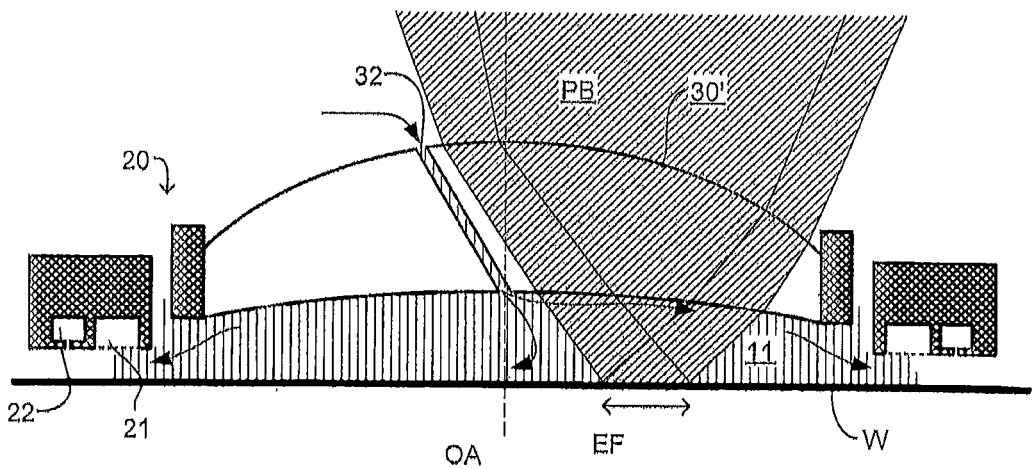
FIG. 7 depicts a final lens element and a liquid supply system in a lithographic projection apparatus according to another embodiment of the present invention.

In a variation of the above described embodiment, shown in FIG. 7, the lens element 30' retains its rotationally symmetric shape, but is provided with a through-hole 32 opening at or near the highest point in the bottom surface of the lens element. The lens element can thereby be made by conventional rotationally symmetric machining and the through-hole provided after, e.g. by drilling or etching. The through-hole 32 is positioned so that it does not interfere with the projection beam PB and therefore does not affect imaging. Using the through-hole 32, the immersion liquid 11 can be refreshed from the highest point underneath the last lens element 30' and a liquid flow that sweeps bubbles away from the center of the lens can be created. The liquid confinement system can also be made symmetric. If the final lens element is made of a material that is soluble in the immersion liquid, e.g. $CaF_2$ in ultra pure water, the through-hole 32 should be lined, e.g. with quartz, to prevent dissolution of the lens element. As discussed above, the element 30' may be an optical element shaped other than as a lens.

An additional possible advantage of an embodiment of the invention is that the flow of immersion liquid cools the final lens element at a position that is close to the projection beam, where it is hottest. Thus, temperature uniformity in the final lens element may be improved.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. In a preferred embodiment, the apparatus, method and/or computer program product as described herein is applied to a single stage/table lithography apparatus.

In an embodiment, there is provided a lithographic projection apparatus, comprising: a projection system configured to project a patterned beam of radiation into an image field that is positioned off the optical axis of the projection system and onto a target portion of a substrate, the projection system comprising a concave refractive lens adjacent the substrate through which the patterned beam is projected; and a liquid supply system configured to provide a liquid to a space between the substrate and the lens.

In an embodiment, the projection system is a catadioptric system. In an embodiment, the lens is cut-away on the opposite side of the optical axis from the image field. In an embodiment, the liquid supply system is arranged to provide liquid from a position adjacent the cutaway of the lens. In an embodiment, the lens is asymmetric about a plane containing the optical axis. In an embodiment, the liquid supply system is arranged to provide liquid from a position at or near the optical axis. In an embodiment, the lens has a first side edge on a first side of the optical axis and a second side edge on a second side of the optical axis, the first side edge being nearer the optical axis than is the second side edge and the image field being on the second side of the optical axis. In an embodiment, the liquid supply system is arranged to provide liquid from a position near the first side edge. In an embodiment, the lens extends substantially only to a position that will be traversed by the beam. In an embodiment, the lens is provided with a through-hole opening at or near the highest point of its concave side such that liquid can be provided through the through-hole.

In an embodiment, there is provided a device manufacturing method, comprising: projecting an image of a pattern through a liquid onto a target portion of a substrate using a projection system, the projection system comprising a concave refractive lens adjacent the substrate through which the image is projected and the image field of the projection system being off-axis.

In an embodiment, the projection system is a catadioptric system. In an embodiment, the lens is cut-away on the opposite side of the optical axis from the image field. In an embodiment, the method comprises providing liquid from a position adjacent the cutaway of the lens. In an embodiment, the lens is asymmetric about a plane containing the optical axis. In an embodiment, the method comprises providing liquid from a position at or near the optical axis. In an embodiment, the lens has a first side edge on a first side of the optical axis and a second side edge on a second side of the optical axis, the first side edge being nearer the optical axis than is the second side edge and the image field being on the second side of the optical axis. In an embodiment, the method comprises providing liquid from a position near the first side edge. In an embodiment, the lens extends substantially only to a position that will be traversed by the image. In an embodiment, the lens is provided with a through-hole opening at or near the highest point of its concave side and comprising providing liquid through the through-hole.

In an embodiment, there is provided a lithographic apparatus, comprising: a projection system configured to project a patterned beam of radiation onto a target portion of a substrate, the projection system comprising an optical element adjacent the substrate and having a surface configured to be in contact with liquid, the surface being inclined at an angle to a horizontal plane and comprising a first portion through which the patterned beam is configured to pass and a second portion, higher than the first portion, through which the patterned does not pass; and a liquid supply system configured to provide a liquid to a space between the substrate and the optical element.

In an embodiment, the projection system is a catadioptric system configured to provide an image field that is positioned off the optical axis of the projection system. In an embodiment, the liquid supply system is arranged to provide liquid from a position adjacent the second portion of the surface of the optical element. In an embodiment, the optical element has a first side edge on a first side of an optical axis of the projection system and a second side edge on a second side of the optical axis, the first side edge being nearer the optical axis than is the second side edge and an image field of projection system being on the second side of the optical axis. In an embodiment, the optical element is provided with a through-hole opening at or near the second portion such that liquid can be provided through the through-hole.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A projection optical system, which projects an image of a pattern arranged on a first plane onto a second plane with illumination light from the pattern, for use in an immersion exposure apparatus which exposes a substrate with the illumination light through the projection optical system and a liquid, the projection optical system comprising:
    a catadioptric arrangement of optical elements comprising a final lens arranged between the second plane and another optical element of the catadioptric arrangement of optical elements,
    a second plane side of the final lens has a light emitting surface a part of which the illumination light passes through,
    a downward-facing surface located above the light emitting surface, wherein
    the final lens is arranged so that the light emitting surface comes in contact with the liquid,
    at least the other optical element is arranged on an optical axis of the projection optical system,
    the image is projected in a projection region on the second plane,
    the projection region is off the optical axis with respect to a first direction perpendicular to the optical axis, and
    a center of the light emitting surface is away from the optical axis with respect to the first direction.

2. The projection optical system according to claim 1, wherein the second plane side of the final lens has a side surface which extends upwardly and radially from the light emitting surface toward the downward-facing surface.

3. The projection optical system according to claim 2, wherein the side surface is located between the light emitting surface and the downward-facing surface.

4. The projection optical system according to claim 2, wherein the side surface is an inclined surface.

5. The projection optical system according to claim 1, wherein the light emitting surface is substantially planar.

6. The projection optical system according to claim 5, wherein a first plane side of the final lens has a convex surface.

7. The projection optical system according to claim 1, wherein the second plane side of the final lens has a portion which is closer to the second plane than the downward-facing surface, and the light emitting surface is located on the portion.

8. The projection optical system according to claim 7, wherein a width of the portion with respect to the first direction is narrower than a width of the portion with respect to a second direction perpendicular to the optical axis and the first direction.

9. The projection optical system according to claim 8, wherein
 a scanning exposure is performed by the immersion exposure apparatus, and
 the substrate is moved to the first direction during the scanning exposure to a single shot region on the substrate.

10. The projection optical system according to claim 8, wherein a width of the projection region with respect to the first direction is narrower than a width of the projection region with respect to the second direction.

11. The projection optical system according to claim 8, wherein the light emitting surface is located nearest to the second plane in the final lens with respect to a direction of the optical axis.

12. The projection optical system according to claim 1, wherein the center of the light emitting surface substantially matches the optical axis with respect to a second direction perpendicular to the optical axis and the first direction.

13. The projection optical system according to claim 1, wherein a position of a center of the light emitting surface substantially matches a position of the center of the projection region with respect to the first direction and a second direction perpendicular to the optical axis and the first direction.

14. The projection optical system according to claim 1, wherein the light emitting surface crosses the optical axis.

15. The projection optical system according to claim 1, wherein
 a scanning exposure is performed by the immersion exposure apparatus, and
 the substrate is moved in the first direction during the scanning exposure to a single shot region on the substrate.

16. The projection optical system according to claim 15, wherein a width of the projection region with respect to the first direction is narrower than a width of the projection region with respect to a second direction perpendicular to the optical axis and the first direction.

17. The projection optical system according to claim 1, wherein the light emitting surface is located nearest to the second plane in the final lens with respect to a direction of the optical axis.

18. An immersion exposure apparatus which exposes a substrate with light from the pattern via the liquid, the apparatus comprising:
 the projection optical system according to claim 1; and
 a liquid supply apparatus which is located around the light emitting surface of the final lens and includes a supply channel to supply the liquid under the light emitting surface, wherein the projection optical system projects the image of the pattern onto the substrate positioned under the final lens through the liquid supplied from the supply channel.

19. An immersion exposure apparatus which exposes a substrate with an illumination light from a pattern through a liquid, the immersion exposure apparatus comprising:
 a projection optical system which projects an image of the pattern with the illumination light;
 a stage which holds the substrate; and
 a liquid supply apparatus that includes a supply channel to supply the liquid on the substrate held on the stage,
 wherein the projection optical system comprises:
 a catadioptric arrangement of optical elements comprising a final lens arranged between the second plane and another optical element of the catadioptric arrangement of optical elements,
 a second plane side of the final lens has a light emitting surface a part of which the illumination light passes through, and
 a downward-facing surface located above the light emitting surface, wherein
 the final lens is arranged so that the light emitting surface comes in contact with the liquid,
 at least the other optical element is arranged on an optical axis of the projection optical system,
 the image is projected in a projection region on the second plane,
 the projection region is off the optical axis with respect to a first direction perpendicular to the optical axis, and
 a center of the light emitting surface is away from the optical axis with respect to the first direction.

20. A projection optical system, which projects an image of a pattern arranged on a first plane onto a second plane with illumination light from the pattern, for use in an immersion exposure apparatus which exposes a substrate with the illumination light through the projection optical system and a liquid, the projection optical system comprising:
 a catadioptric arrangement of optical elements comprising a final lens arranged between the second plane and another optical element of the catadioptric arrangement of optical elements,
 a second plane side of the final lens has
 a light emitting surface a part of which the illumination light passes through, and
 a downward-facing surface located above the light emitting surface,
 the final lens is arranged so that the light emitting surface comes in contact with the liquid,
 at least the other optical element is arranged on an optical axis of the projection optical system,
 the image is projected in a projection region on the second plane,
 the projection region is off the optical axis with respect to a first direction perpendicular to the optical axis, and
 a center of the light emitting surface is away from the optical axis with respect to the first direction.

21. The projection optical system according to claim 20, wherein the second plane side of the final lens has a surface which extends upwardly and radially from the light emitting surface.

22. The projection optical system according to claim 21, wherein the surface which extends upwardly and radially from the light emitting surface is located between the light emitting surface and a surface facing toward the second plane.

23. The projection optical system according to claim 20, wherein a first plane side of the final lens has a convex surface.

24. The projection optical system according to claim 20, wherein the downward-facing surface is substantially planar.

25. The projection optical system according to claim 20, wherein a width of at least a portion of the final lens with respect to the first direction is narrower than a width of the at least portion with respect to a second direction perpendicular to the optical axis and the first direction.

26. The projection optical system according to claim 25, wherein a width of the projection region with respect to the first direction is narrower than a width of the projection region with respect to the second direction.

27. The projection optical system according to claim 20, wherein the center of the light emitting surface substantially matches the optical axis with respect to a second direction perpendicular to the optical axis and the first direction.

28. The projection optical system according to claim 20, wherein a position of a center of the light emitting surface substantially matches a position of the center of the projection region with respect to the first direction and a second direction perpendicular to the optical axis and the first direction.

29. The projection optical system according to claim 20, wherein the light emitting surface crosses the optical axis.

30. The projection optical system according to claim 20, wherein a width of the projection region with respect to the first direction is narrower than a width of the projection region with respect to a second direction perpendicular to the optical axis and the first direction.

31. An immersion exposure apparatus which exposes a substrate with light from the pattern via the liquid, the apparatus comprising:
the projection optical system according to claim 20; and
a liquid supply apparatus which is located around the light emitting surface of the final lens and includes a supply channel to supply the liquid under the light emitting surface, wherein the projection optical system projects the image of the pattern onto the substrate positioned under the final lens through the liquid supplied from the supply channel.

32. An immersion exposure apparatus which exposes a substrate with an illumination light from a pattern through a liquid, the immersion exposure apparatus comprising:
a projection optical system which projects an image of the pattern with the illumination light;
a stage which holds the substrate; and
a liquid supply apparatus that includes a supply channel to supply the liquid on the substrate held on the stage,
wherein the projection optical system comprises:
a catadioptric arrangement of optical elements comprising a final lens arranged between the second plane and another optical element of the catadioptric arrangement of optical elements,
a second plane side of the final lens has:
a light emitting surface a part of which the illumination light passes through, and
a downward-facing surface located above the light emitting surface,
the final lens is arranged so that the light emitting surface comes in contact with the liquid,
at least the other optical element is arranged on an optical axis of the projection optical system,
the image is projected in a projection region on the second plane,
the projection region is off the optical axis with respect to a first direction perpendicular to the optical axis, and
a center of the light emitting surface is away from the optical axis with respect to the first direction.

33. A projection optical system, which projects an image of a pattern arranged on a first plane onto a second plane with illumination light from the pattern, for use in an immersion exposure apparatus which exposes a substrate with the illumination light through the projection optical system and a liquid, the projection optical system comprising:
a catadioptric arrangement of optical elements comprising a final lens arranged between the second plane and another optical element of the catadioptric arrangement of optical elements,
a second plane side of the final lens has a light emitting surface a part of which the illumination light passes through,
the final lens is arranged so that the light emitting surface comes in contact with the liquid,
the image is projected in a projection region on the second plane,
the projection region is off an optical axis of the projection system with respect to a first direction perpendicular to the optical axis, and
a center of the light emitting surface is away from the optical axis lens with respect to the first direction.

* * * * *

UNITED STATES PATENT AND TRADEMARK OFFICE
CERTIFICATE OF CORRECTION

PATENT NO. : 10,495,981 B2  
APPLICATION NO. : 15/479084  
DATED : December 3, 2019  
INVENTOR(S) : Johannes Catharinus Hubertus Mulkens et al.

Page 1 of 1

It is certified that error appears in the above-identified patent and that said Letters Patent is hereby corrected as shown below:

On the Title Page

On page 3, item (56) References Cited:  
Please add the following missed references under FOREIGN PATENT DOCUMENTS:  
-- 2004097911    11/2004 PCT  
2004053534    06/2004 PCT  
2004088650    10/2004 PCT  
200213194     02/2002 PCT  
2005101121    10/2005 PCT  
2004107011    12/2004 PCT --

Signed and Sealed this  
Seventeenth Day of March, 2020

Andrei Iancu  
*Director of the United States Patent and Trademark Office*